United States Patent [19]
Lin et al.

[11] Patent Number: 6,018,166
[45] Date of Patent: Jan. 25, 2000

[54] POLYSILICON CARBON SOURCE/DRAIN HETEROJUNCTION THIN-FILM TRANSISTOR

[75] Inventors: Kang-Cheng Lin, Chung Ho; Hong-Jye Hong, Taichung, both of Taiwan

[73] Assignee: Industrial Technology Research Institute, Hsinchu, Taiwan

[21] Appl. No.: 09/124,680

[22] Filed: Jul. 30, 1998

Related U.S. Application Data

[62] Division of application No. 08/775,603, Dec. 31, 1996, Pat. No. 5,811,325.

[51] Int. Cl.$^7$ .......................... H01L 21/84; H01L 29/167
[52] U.S. Cl. ................................ 257/22; 257/57; 257/77; 257/225; 257/412; 257/756; 438/159; 438/160
[58] Field of Search .................................. 257/22, 57, 77, 257/225, 412, 756; 438/159, 160

[56] References Cited

U.S. PATENT DOCUMENTS

| | | | |
|---|---|---|---|
| 5,189,504 | 2/1993 | Nakayama et al. | 257/422 |
| 5,369,040 | 11/1994 | Halvis et al. | 257/225 |
| 5,811,325 | 9/1998 | Lin et al. | 438/159 |

*Primary Examiner*—Wael Fahmy
*Assistant Examiner*—Hung Van Duong
*Attorney, Agent, or Firm*—Sughrue, Mion, Zinn, Macpeak & Seas, PLLC

[57] ABSTRACT

The present invention includes forming a conductive layer on a substrate. Portions of the conductive layer are removed using a first photoresist layer as a mask. A first oxide layer is formed over the conductive layer and the substrate, and an amorphous silicon layer is then formed on the first oxide layer. After annealing the amorphous silicon layer, thereby transforming amorphous silicon layer to a polysilicon layer, a second oxide layer is formed on the polysilicon layer. The second oxide layer is removed using a second photoresist layer as a mask. An amorphous silicon carbon layer is formed over the second oxide layer and the polysilicon layer, and a heavily-doped amorphous silicon carbon layer is formed on the amorphous silicon carbon layer. After annealing the heavily-doped amorphous silicon carbon layer and the amorphous silicon carbon layer, thereby transforming the heavily-doped amorphous silicon carbon layer to a heavily-doped polysilicon carbon layer, and transforming the amorphous silicon carbon layer to a polysilicon carbon layer, portions of the polysilicon carbon layer, the heavily-doped polysilicon carbon layer and the polysilicon layer are removed using a third photoresist layer as a mask.

14 Claims, 11 Drawing Sheets

POLYSILICON CARBON SOURCE/DRAIN HETEROJUNCTION THIN-FILM TRANSISTOR

This is a divisional of Application Ser. No. 08/775,603 filed Dec. 31, 1996 now U.S. Pat. No. 5,811,325, the disclosure of which is incorporated herein by reference.

BACKGROUND OF THE INVENTION

1. Field of the Invention

The present invention relates to a thin-film transistor, and particularly to a polysilicon carbon source/drain heterojunction thin-film transistor.

2. Description of the Prior Art

Amorphous silicon (a-Si) is used in the deposition of thin-film transistor (TFT) for liquid-crystal displays. Amorphous semiconductors do not have a crystalline lattice, and this specific disordered nature results in a large number of localized states with energy within the energy gap. The localized states in the upper and lower half of the gap behave like acceptors and donors respectively, which are used to implement a switching element for the liquid-crystal display (LCD). As the density and the quality of the pixels on the LCD increase along the advancement of the semiconductor industry, the amorphous silicon is no longer adequate due to its low mobility. High-mobility polysilicon is therefore a candidate for manufacturing TFTs on the liquid-crystal display.

Figure 1A:
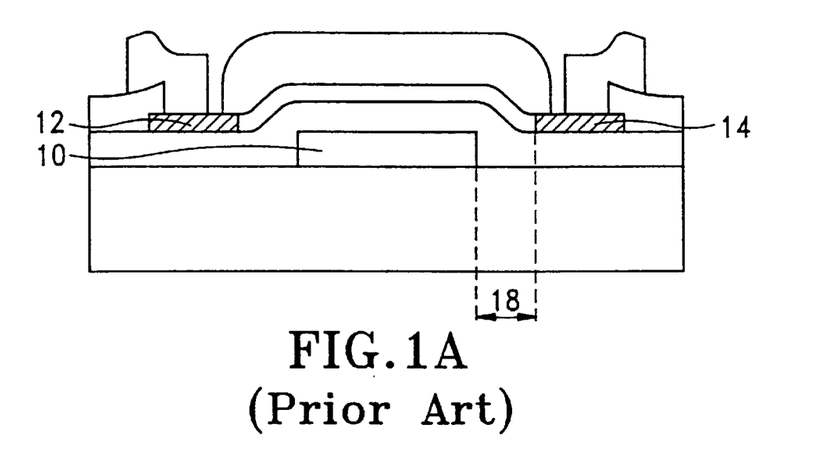
FIG. 1A shows the cross-sectional view of a conventional thin-film transistor (TFT).
Figure 1B:
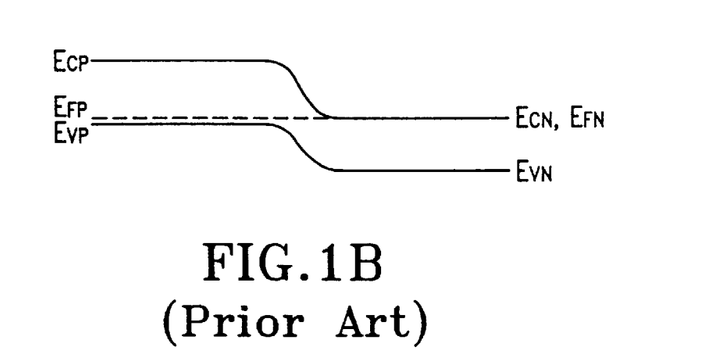
FIG. 1B shows a conventional energy band diagram when $V_{GS}$ is less than threshold voltage $V_{th}$ and no $V_{DS}$ voltage bias is applied to the TFT.

FIG. 1A shows the cross-sectional view of a conventional TFT with a gate, a $n^+$ polysilicon drain region and a $n^+$ polysilicon drain region designated respectively as 10, 12 and 14. At least 5 volts is usually applied between the drain 14 and the source region 12 during its operation. When the TFT is in an off state with the gate-to-source voltage $V_{GS}$ less than the threshold voltage $V_{th}$, the potential of the aforementioned drain-to-source voltage $V_{DS}$ almost crosses an depletion region near the drain region 14, thereby generating a large electrical field, and a large number of associated electron-hole pairs. FIG. 1B shows an energy band diagram when no $V_{DS}$ voltage bias is applied and the gate voltage $V_{GS}$ is less than $V_{th}$, where the TFT behaves as a natural p-n junction, and where subscript c designates the conduction band, v the valence band, F the firmi level, and n, p the polarity of the material for the TFT.

Figure 1C:
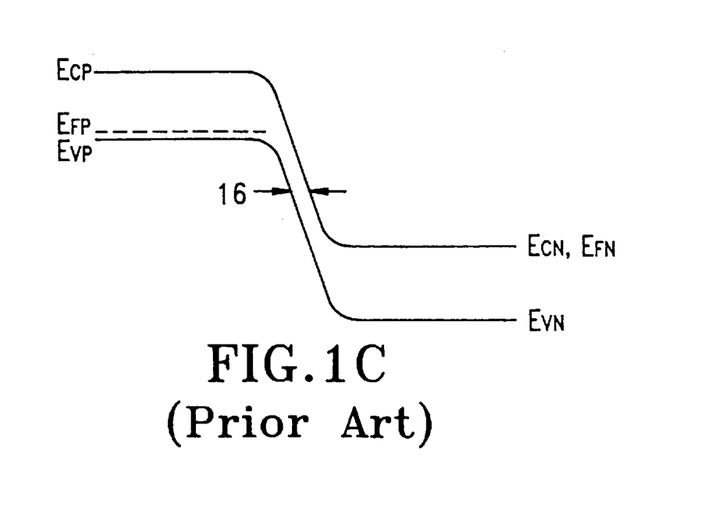
FIG. 1C shows a conventional energy band diagram when a normal $V_{DS}$ bias such as 5 volts, and $V_{GS}$ less than $V_{th}$ are applied to the TFT.

As the gate voltage $V_{GS}$ is less than $V_{th}$ and the drain 14 -to- source 12 is biased in a normal operation, most part of $V_{DS}$ is dropped at the p-n depletion junction near the drain 14. The aforementioned generated holes on the left p side are apt to go over the barrier according to the quantum tunneling effect due to its narrow width 16 as shown in FIG. 1C, even an offset regions 18 (FIG. 1A) are provided.

SUMMARY OF THE INVENTION

In accordance with the present invention, a method is provided for forming a polysilicon carbon source/drain heterojunction thin-film transistor that substantially decreases leakage current under reverse voltage bias. In one embodiment, the present includes forming a conductive layer on a substrate, followed by forming a first photoresist layer on the conductive layer, wherein the first photoresist layer defines a gate area over a portion of the substrate. Portions of the conductive layer are then removed using the first photoresist layer as a mask. Next, a first oxide layer is formed over the conductive layer and the substrate, and an amorphous silicon layer is formed on the first oxide layer. After annealing the amorphous silicon layer, thereby transforming the amorphous silicon layer to a polysilicon layer, a second oxide layer is formed on the polysilicon layer. Afterwards, a second photoresist layer is formed on the second oxide layer, where the second photoresist layer defines an area aligned to the gate area. After the second oxide layer is removed using the second photoresist layer as a mask, a heavily-doped amorphous silicon carbon layer is formed over the second oxide layer and the polysilicon layer. After annealing the heavily-doped amorphous silicon carbon layer, thereby transforming the heavily-doped amorphous silicon carbon layer to a heavily-doped polysilicon carbon layer, a third photoresist layer is formed on the heavily-doped polysilicon carbon layer, where the third photoresist layer defines a source/drain area. Portions of the heavily-doped-polysilicon carbon layer and the polysilicon layer are then removed using the third photoresist layer as a mask.

In another embodiment according to the present invention, all the steps for forming the polysilicon carbon source/drain heterojunction thin-film transistor are the same as the first embodiment except that an amorphous silicon carbon layer is further formed over the second oxide layer and the polysilicon layer prior forming the heavily-doped amorphous silicon carbon layer. This amorphous silicon carbon layer is subsequently annealed and transformed to a polysilicon carbon layer.

DESCRIPTION OF THE PREFERRED EMBODIMENT

Figure 2:
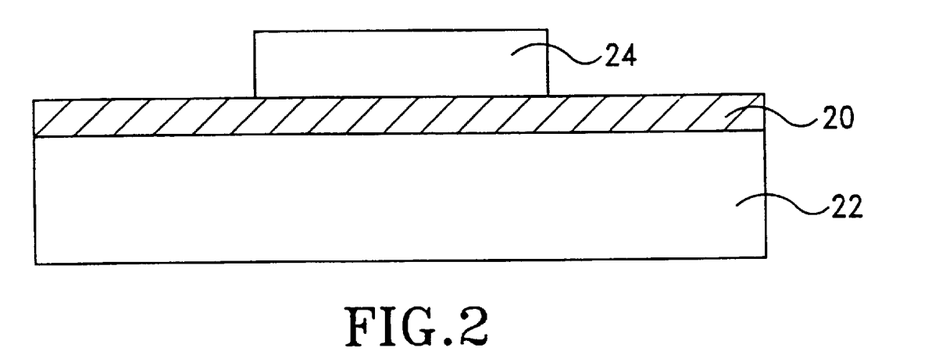
FIGS. 2 to 10 show cross-sectional views illustrative of various stages in the fabrication of a polysilicon carbon source/drain heterojunction thin-film transistor in accordance with the first embodiment of the present invention.

Referring to FIG. 2, a conductive layer 20 such as a Al or Cr metal layer is formed on a glass substrate 22 using a standard sputtering process, typically to a thickness of about 1500 to 2500 angstroms. An alternative way to replace the conductive layer 20 is a doped polysilicon layer deposited using a low pressure chemical vapor deposition (LPCVD) process. Afterwards, conventional photolithography techniques are used to define a gate area in a photoresist layer 24 formed on the conductive layer 20. The photoresist layer 24 is patterned to expose portions of the conductive layer 20 over the substrate 22.

Figure 3:
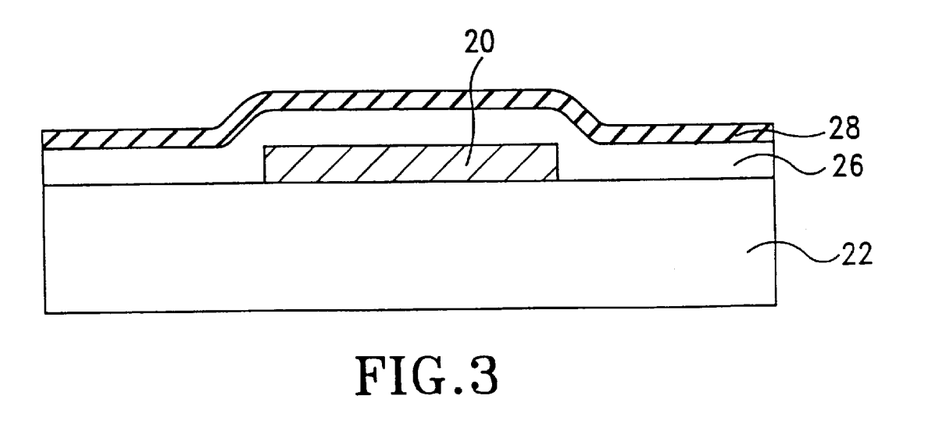

Using the photoresist layer 24 as a mask, the conductive layer 20 is etched, resulting in a gate region 20 shown in FIG. 3. In this embodiment, a solution of the mixture of $H_3PO_4$, $HNO_3$, $CH_3COOH$ and $H_2O$ is used to etch the aluminum, or a plasma etch process with etchant of $SF_6/Cl_2$ is used to etch the doped polysilicon. Next, an oxide layer 26, such as amorphous silicon oxide (a-SiOx), is formed over the gate region 20 and the substrate 22 to a thickness of about 1500 to 2500 angstroms, followed by forming an amorphous silicon layer 28 to a thickness of about 500 angstroms. In this embodiment, a conventional plasma enhanced chemical vapor deposition (PECVD) process is used to form the oxide layer 26 and the amorphous silicon layer 28 for a poly-gate structure. It is noted that the amorphous silicon oxide layer 26 for the poly-gate structure can be replaced by a tetraethoxysilane (TEOS) layer.

Figure 4:
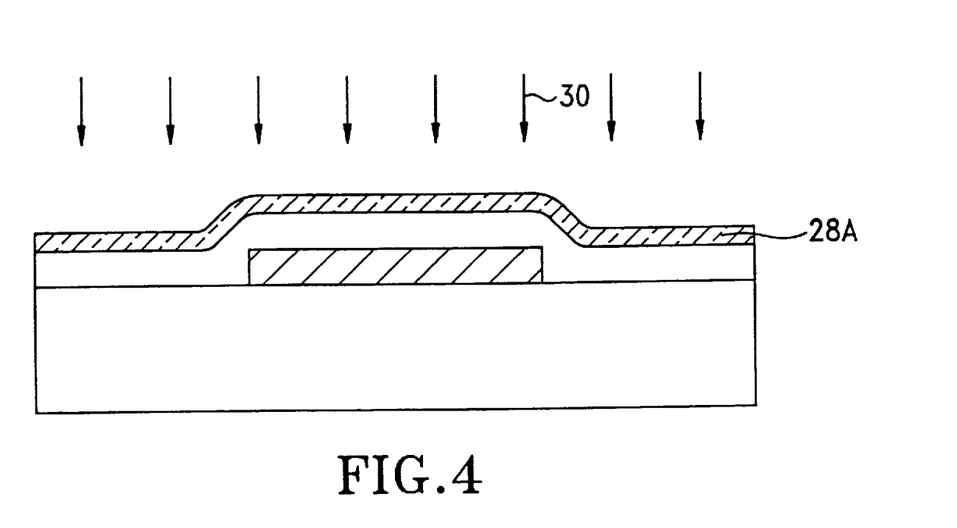

The structure of FIG. 3 is then subject to an annealing process 30 such as a standard laser annealing process, so that the amorphous silicon layer 28 is transformed to a polysilicon layer 28A as shown in FIG. 4. It is appreciated that a conventional thermal annealing process could be used instead for the poly-gate structure.

Figure 5:
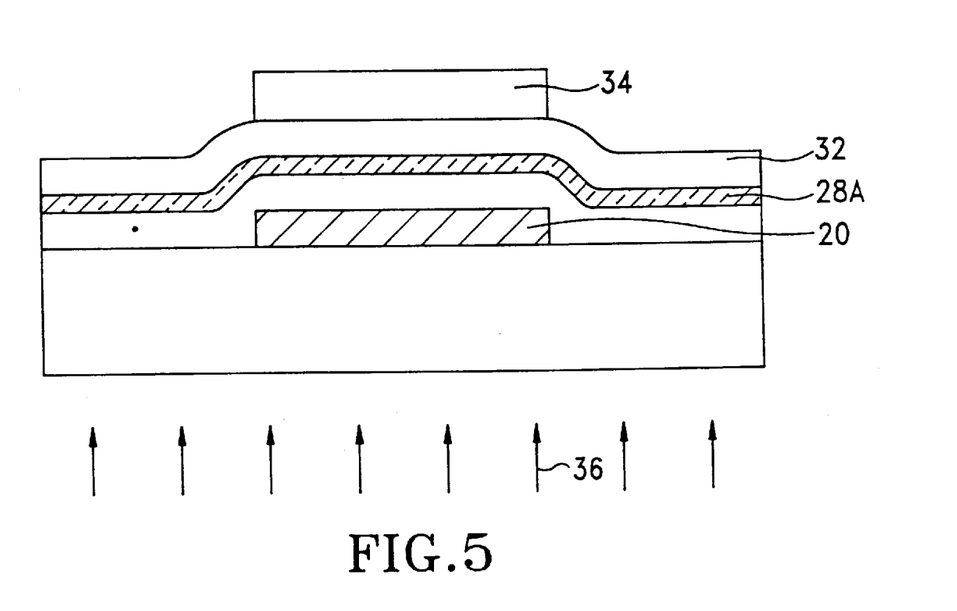

Referring to FIG. 5, another oxide layer 32, such as amorphous silicon oxide (a-SiO$_x$), is formed on the polysilicon layer 28A to a thickness of about 2000~3000 angstroms. The method used to form this oxide layer 32 is the same as the oxide layer 26, and a TEOS layer could be used to replace the oxide layer 32 for the poly-gate structure. Afterwards, conventional photolithography techniques are used to define an area aligned to the gate region 20 in a photoresist layer 34 formed on the oxide layer 32. The photoresist layer 34 is patterned by a back-side exposure 36 to expose portions of the oxide layer 32. Using the photoresist layer 34 as a mask, the oxide layer 32 is etched, resulting in an oxide layer 32 shown in FIG. 6. In this embodiment, a solution of BOE is used to etch the oxide layer 32. Subsequently, an n$^+$ amorphous silicon carbon (a-SiC$_x$) layer 38 having a thickness of about 300~1000 angstroms. In this embodiment, a conventional PECVD process is used to form the n$^+$ amorphous silicon carbon layer 38 for the metal gate structure, or a standard LPCVD process for the poly-gate structure. Typically, the n$^+$ amorphous silicon carbon layer 38 is doped with P$^+$ or As$^+$ dopants at a concentration of about $10^{15}/cm^2$ to form a heavily-doped amorphous silicon carbon layer 38.

Figure 6:
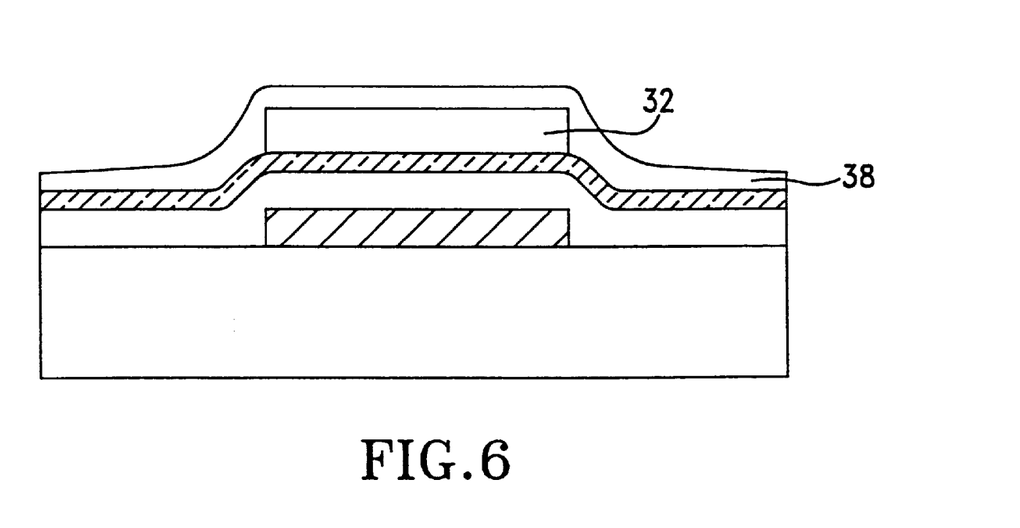
Figure 7:
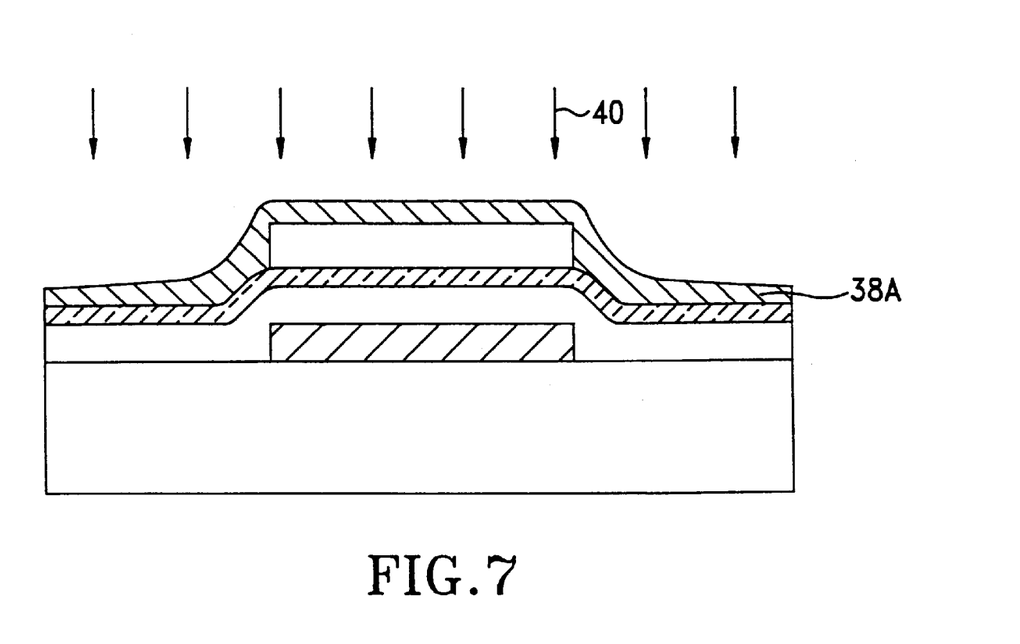

The structure of FIG. 6 is then subject to an annealing process 40 such as a laser annealing process, so that the n$^+$ amorphous silicon carbon layer 38 is transformed to a n$^+$ polysilicon carbon layer 38A as shown in FIG. 7. It is appreciated that a conventional thernal annealing process could be used instead for the poly-gate structure.

Figure 8:
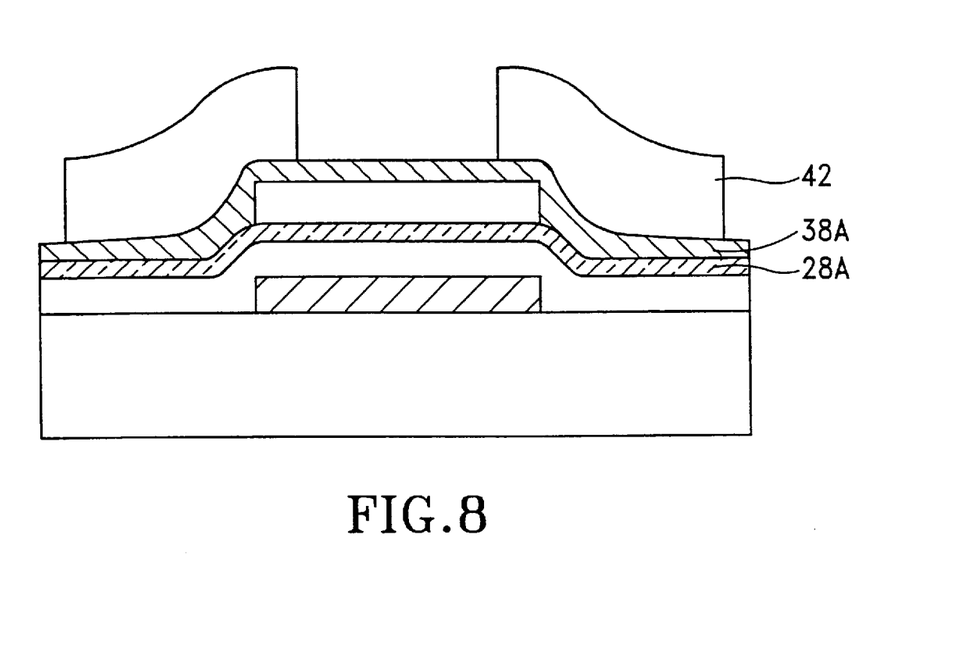
Figure 9:
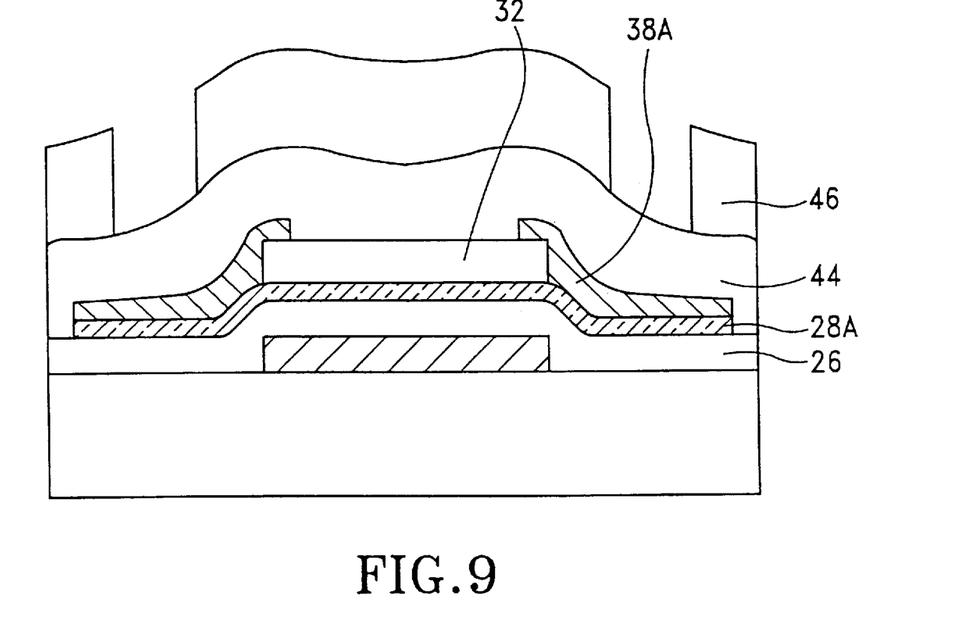

Referring to FIG. 8, conventional photolithography techniques are used to define source/drain area in a photoresist layer 42 formed on the n$^+$ polysilicon carbon layer 38A. The photoresist layer 42 is patterned to expose portions of the n$^+$ polysilicon carbon layer 38A. Using the photoresist layer 42 as a mask, the n$^+$ polysilicon carbon layer 38A and the polysilicon layer 28A are etched, resulting in the structure of FIG. 9.

Figure 10:
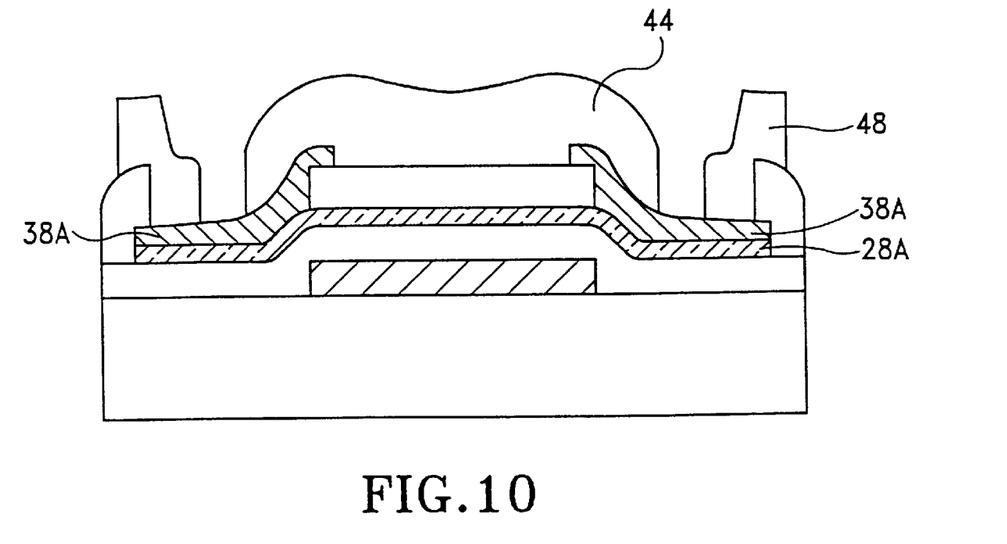

Next, a passivation layer 44 such as a-SiN$_x$:H is formed over the oxide layer 32, the polysilicon layer 28A and the amorphous silicon oxide layer 26. The nominal thickness of the passivation layer 44 is about 3000 angstroms, but can also be in the range from about 2000 to 6000 angstroms. Afterwards, conventional photolithography techniques are used to define source/drain contact area in a photoresist layer 46 formed on the passivation layer 44. The photoresist layer 46 is patterned to expose portions of the passivation layer 44. Using the photoresist layer 44 as a mask, the passivation layer 44 is etched, resulting in source/drain contact regions as shown in FIG. 10. In this embodiment, the a-SiN$_x$:H layer 44 is etched by reactive ion etching using the gas of mixture of CF$_4$ and O$_2$. Subsequently, metal contacts 48 such as aluminum are formed using a conventional sputtering process.

Figure 11A:
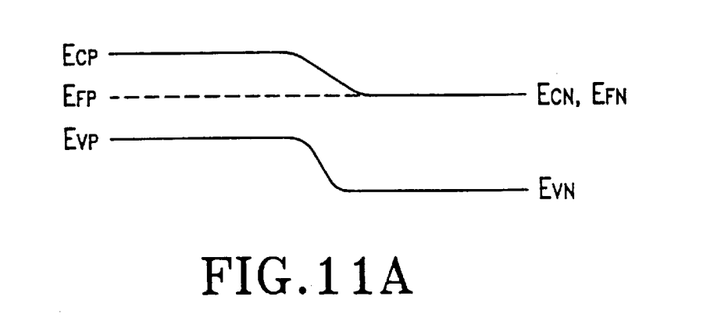
FIG. 11A shows an energy band diagram when no voltage bias is applied to the TFT in accordance with the first embodiment of the present invention.
Figure 11B:
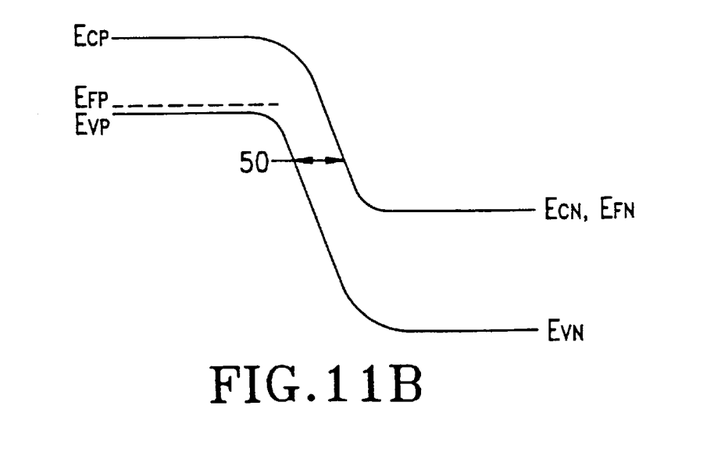
FIG. 11B shows an energy band diagram when a normal $V_{DS}$ bias such as 5 volts, and $V_{GS}$ less than $V_{th}$ are applied to the TFT in accordance with the first embodiment of the present invention.

FIG. 11A shows an energy band diagram for the resulting polysilicon carbon source/drain heterojunction thin-film transistor (FIG. 10) as no voltage bias is applied. When the source/drain regions 38A are reverse biased and the gate voltage ($V_{GS}$) is less than the threshold voltage $V_{th}$, most bias of $V_{DS}$ is dropped at the junction near the drain. Compared with the energy band diagram of FIG. 1C, the width 50 for the embodiment of the present invention is larger than the width 16 in FIG. 1C due to the formed heterojunction consisting of the n$^+$ polysilicon carbon layer 38A and the polysilicon layer 28A, therefore reducing the tunneling effect and the associated leakage current.

Figure 12:
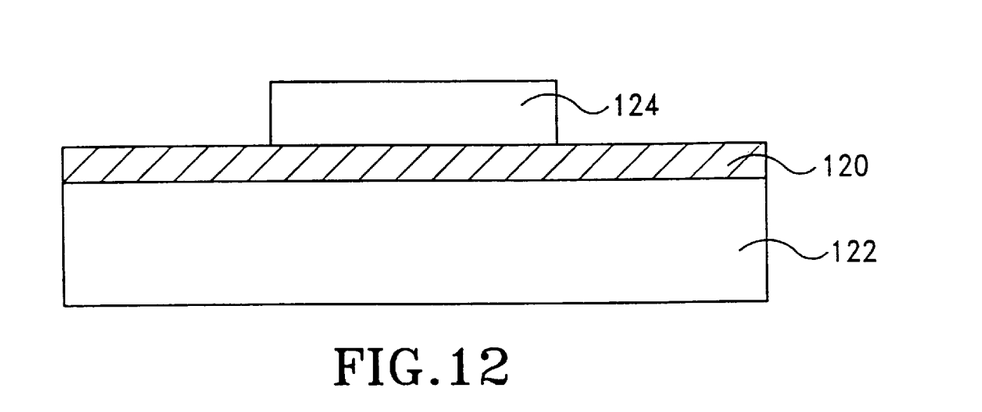
FIGS. 12 to 20 show cross-sectional views illustrative of various stages in the fabrication of a polysilicon carbon source/drain heterojunction thin-film transistor in accordance with the second embodiment of the present invention.

FIGS. 12 to 20 illustrate another embodiment according to the present invention. Referring to FIG. 12, a conductive layer 120 such as an aluminum or Cr metal layer is formed on a glass substrate 122. An alternative way to replace the conductive layer 120 is a doped polysilicon layer deposited using a low pressure chemical vapor deposition (LPCVD) process. Using a photoresist layer 124 as a mask, the conductive layer 120 is etched, resulting in a gate region 120 shown in FIG. 13. Next, an oxide layer 126, such as amorphous silicon oxide (a-SiOx), is formed over the gate region 120 and the substrate 122, followed by forming an amorphous silicon layer 128.

Figure 13:
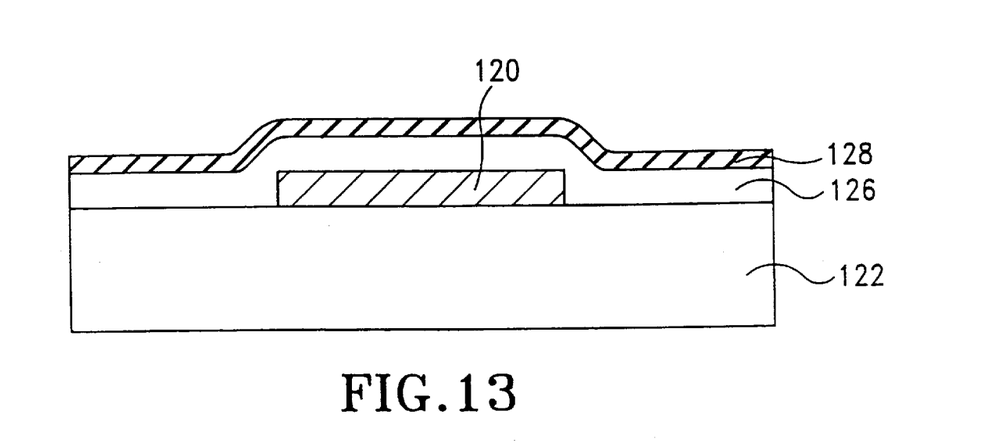
Figure 14:
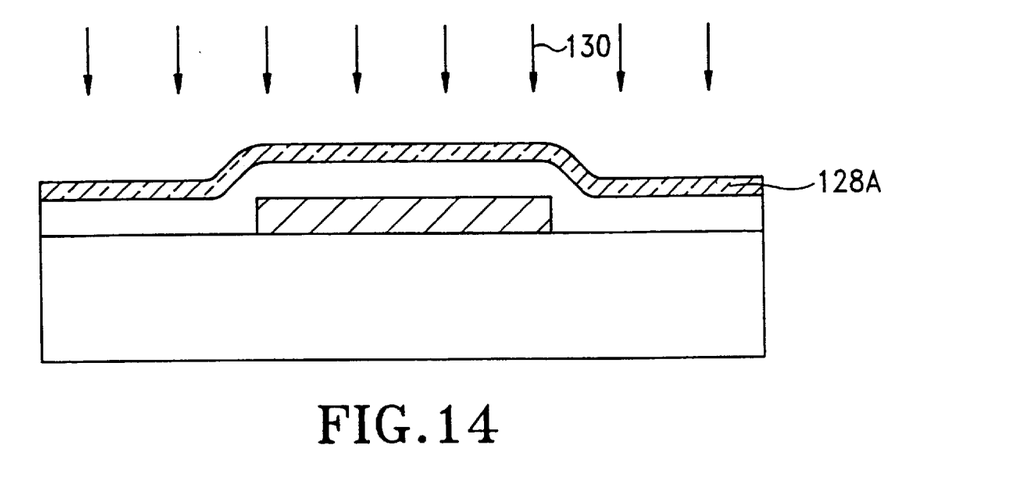

The structure of FIG. 13 is then subject to an annealing process 130 such as a standard laser annealing process, so that the amorphous silicon layer 128 is transformed to a polysilicon layer 128A as shown in FIG. 14. It is appreciated that a conventional thermal annealing process could be used instead for the poly-gate structure.

Figure 15:
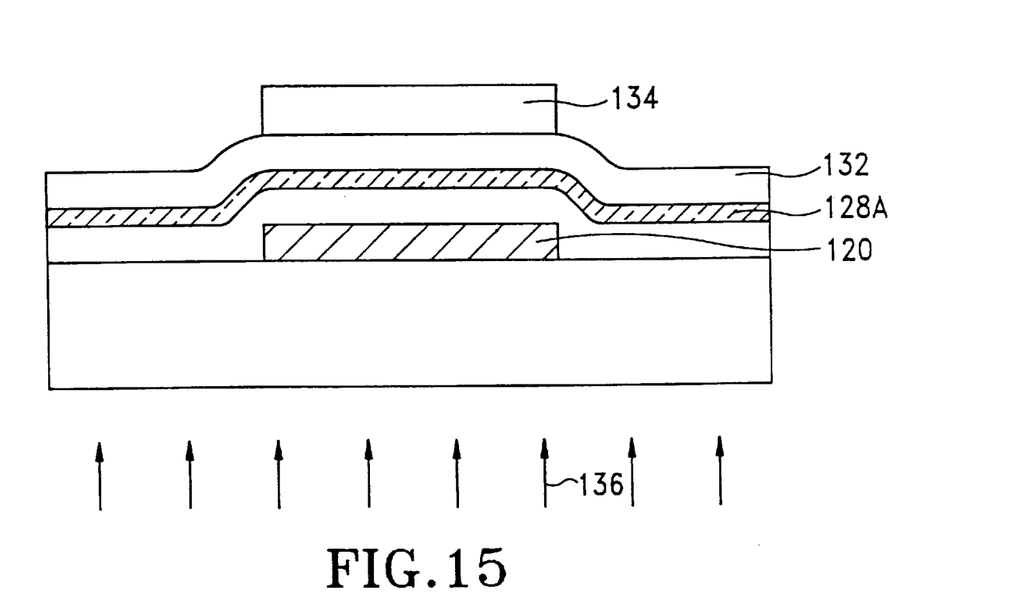

Referring to FIG. 15, another oxide layer 132, such as amorphous silicon oxide (a-SiO$_x$), is formed on the polysilicon layer 128A. Afterwards, conventional photolithography techniques are used to define an area aligned to the gate region 120 in a photoresist layer 134 formed on the oxide layer 132. The photoresist layer 134 is patterned by a back-side exposure 136 to expose portions of the oxide layer 132. Using the photoresist layer 134 as a mask, the oxide layer 132 is etched, resulting in an oxide layer 132 shown in FIG. 16. The main difference from the previous embodiment is that an amorphous silicon carbon layer 137 having a thickness of about 100~1000 angstroms is formed prior forming an n$^+$ amorphous silicon carbon (a-SiC$_x$) layer 138 having a thickness of about 400~500 angstroms. In this embodiment, a conventional PECVD process is used to form the amorphous silicon carbon layer 137 and the n$^+$ amorphous silicon carbon layer 138 for the metal gate structure, or a standard LPCVD process for the poly-gate structure.

Figure 16:
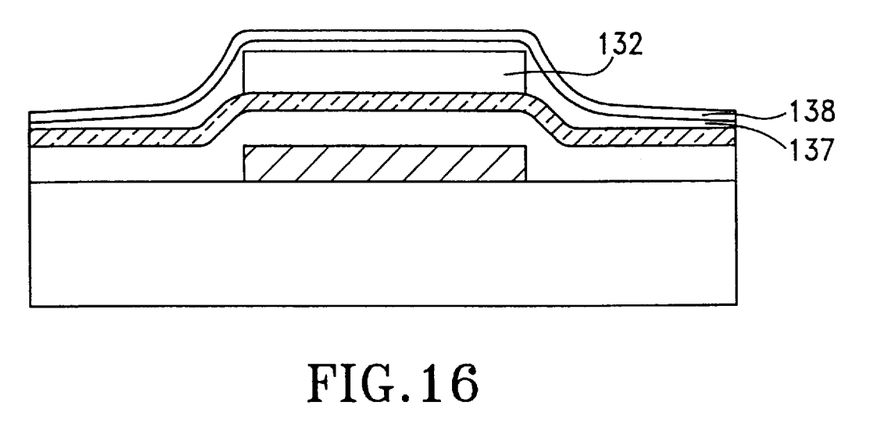
Figure 17:
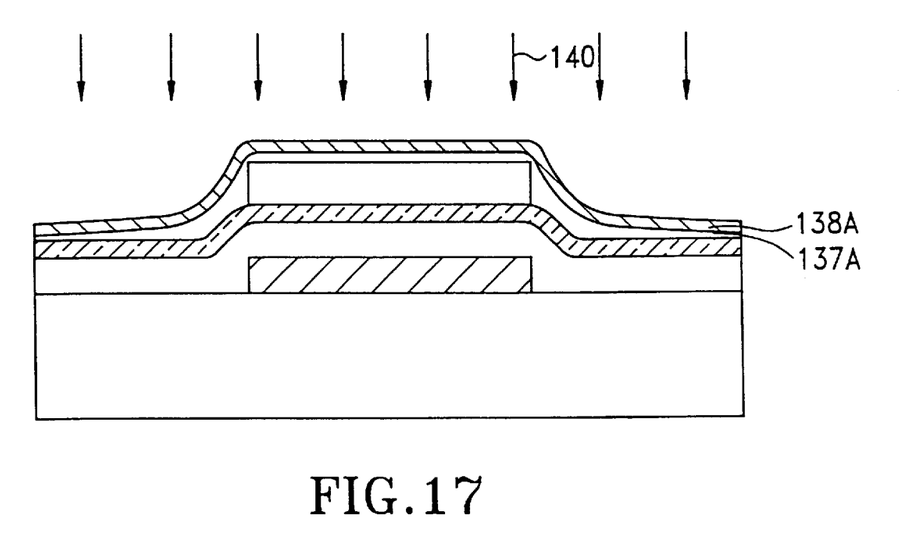

The structure of FIG. 16 is then subject to an annealing process 140 such as a laser annealing process, so that the amorphous silicon carbon layer 137 is transformed to a polysilicon carbon layer 137A, and the n+ amorphous silicon carbon layer 138 is transformed to an n+ polysilicon carbon layer 138A as shown in FIG. 17. It is appreciated that a conventional thermal annealing process could be used instead for the poly-gate structure.

Figure 18:
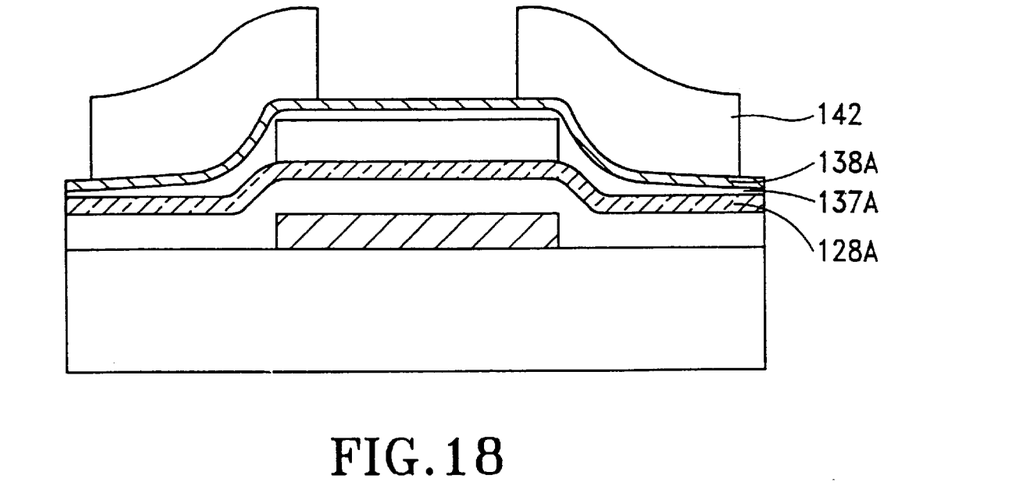
Figure 19:
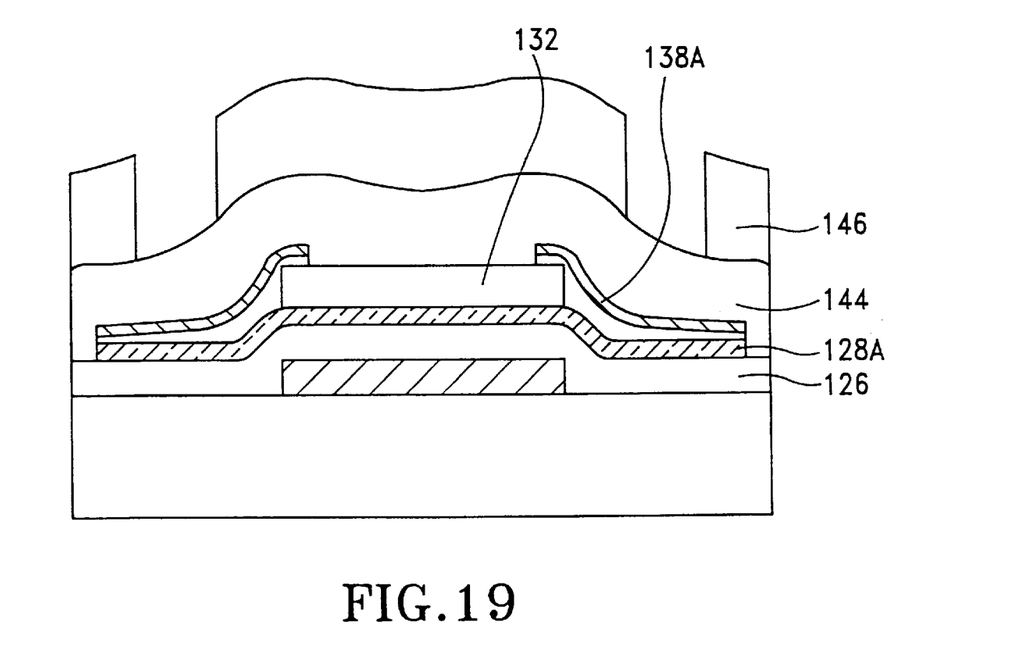

Referring to FIG. 18, a conventional photolithography techniques are used to define source/drain area in a photoresist layer 142 formed on the n+ polysilicon carbon layer 138A. The photoresist layer 142 is patterned to expose portions of the n+ polysilicon carbon layer 138A. Using the photoresist layer 142 as a mask, the amorphous silicon carbon layer 137, the n+ polysilicon carbon layer 138A and the polysilicon layer 128A are etched, resulting in the structure of FIG. 19.

Figure 20:
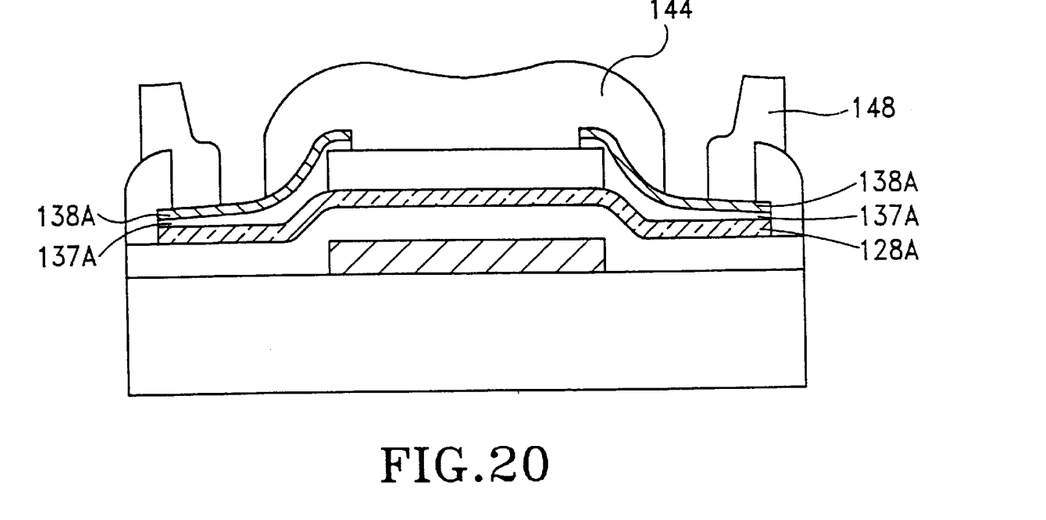

Next, a passivation layer 144 is formed over the oxide layer 132, the polysilicon layer 128A and the amorphous silicon oxide layer 126. Afterwards, a photoresist layer 46 is patterned to expose portions of the passivation layer 144. Using the photoresist layer 144 as a mask, the passivation layer 144 is etched, resulting in source/drain contact regions as shown in FIG. 20. Subsequently, metal contacts 148 such as aluminum are formed.

Figure 21A:
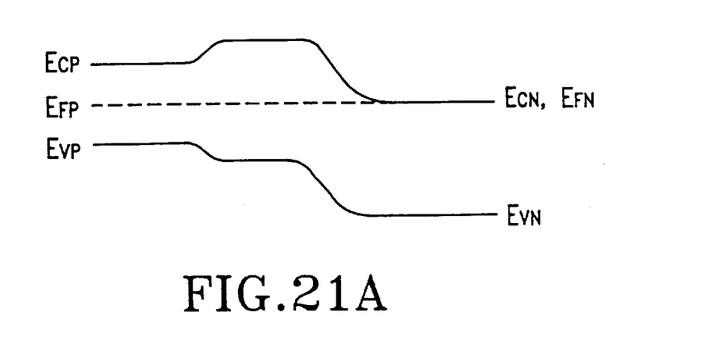
FIG. 21A shows an energy band diagram when no voltage bias is applied to the TFT in accordance with the second embodiment of the present invention.
Figure 21B:
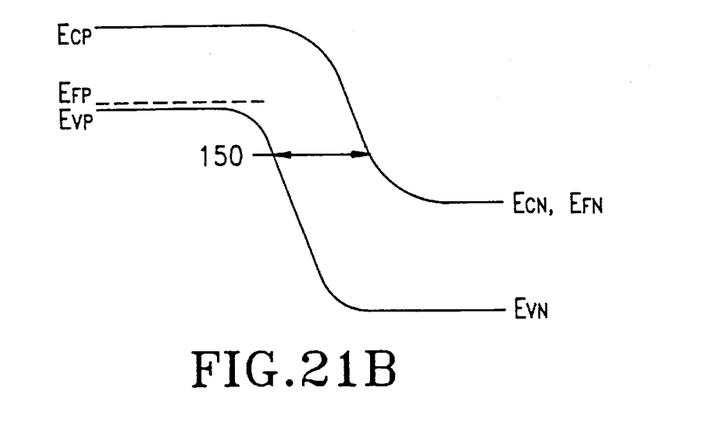
FIG. 21B shows an energy band diagram when a normal $V_{DS}$ bias such as 5 volts, and $V_{GS}$ less than $V_{th}$ are applied to the TFT in accordance with the second embodiment of the present invention.

FIG. 21A shows an energy band diagram for the resulting polysilicon carbon source/drain heterojunction thin-film transistor (FIG. 20) as no voltage bias is applied. When the source/drain regions 138A are reverse biased and the gate voltage ($V_{GS}$) is less than the threshold voltage $V_{th}$, most bias $V_{DS}$ is dropped at the junction near the drain. Compared with the energy band diagram of FIG. 1C, the width 150 for the embodiment of the present invention is larger than the width 16 in FIG. 1C due to the formed heterojunction consisting of the n+ polysilicon carbon layer 138A and the polysilicon layer 128A, therefore reducing the tunneling effect and the associated leakage current. Furthermore, the heterojunction thus formed is used as a vertical offset region instead of a horizontal offset region used in a conventional TFT, thereby occupying less area and making high-density integrated circuit possible.

Although specific embodiments have been illustrated and described, it will be obvious to those skilled in the art that various modifications may be made without departing from the spirit which is intended to be limited solely by the appended claims.

What is claimed is:

1. A polysilicon carbon source/drain heterojunction thin-film transistor, comprising:
   a conductive gate region formed on a substrate;
   a first oxide region formed over said conductive gate and the substrate;
   a polysilicon region formed on a portion of said first oxide region, said polysilicon region covering said conductive gate region;
   a second oxide region formed on a portion of said polysilicon region, said second oxide region being aligned with said conductive gate; and
   source/drain regions abutting said polysilicon region, the source region being spaced from the drain region by said second oxide region, said source/drain regions comprising heavily-doped polysilicon carbon.

2. The polysilicon carbon source/drain heterojunction thin-film transistor according to claim 1, wherein said conductive gate region comprises metal.

3. The polysilicon carbon source/drain heterojunction thin-film transistor according to claim 2, wherein said metal is aluminum.

4. The polysilicon carbon source/drain heterojunction thin-filmr transistor according to claim 1, wherein said conductive gate region comprises doped polysilicon.

5. The polysilicon carbon source/drain heterojunction thin-film transistor according to claim 1, wherein said first oxide region comprises amorphous silicon oxide.

6. The polysilicon carbon source/drain heterojunction thin-film transistor according to claim 1, wherein said second oxide layer comprises amorphous silicon oxide.

7. The polysilicon carbon source/drain heterojunction thin-film transistor according to claim 1, further comprising:
   a passivation region abutting said second oxide region and a portion of said source/drain regions; and
   conductive contact regions adjacent a portion of said source/drain region not covered by said passivation region.

8. A polysilicon carbon source/drain heterojunction thin-film transistor, comprising:
   a conductive gate region formed on a substrate;
   a first oxide region formed over said conductive gate and the substrate;
   a polysilicon region formed on a portion of said first oxide region, said polysilicon region covering said conductive gate region;
   a second oxide region formed on a portion of said polysilicon region, said second oxide region being aligned with said conductive gate; and
   source/drain regions abutting said polysilicon region, the source region being spaced from the drain region by said second oxide region, said source/drain regions comprising:
   (a) polysilicon carbon regions abutting said polysilicon region; and
   (b) heavily-doped polysilicon carbon regions on said polysilicon carbon regions, said heavily-doped polysilicon carbon regions being aligned with said polysilicon carbon regions.

9. The polysilicon carbon source/drain heterojunction thin-film transistor according to claim 8, wherein said conductive gate region comprises metal.

10. The polysilicon carbon source/drain heterojunction thin-film transistor according to claim 9, wherein said metal is aluminum.

11. The polysilicon carbon source/drain heterojunction thin-film transistor according to claim 8, wherein said conductive gate region comprises doped polysilicon.

12. The polysilicon carbon source/drain heterojunction thin-film transistor according to claim 8, wherein said first oxide region comprises amorphous silicon oxide.

13. The polysilicon carbon source/drain heterojunction thin-film transistor according to claim 8, wherein said second oxide layer comprises amorphous silicon oxide.

14. The polysilicon carbon source/drain heterojunction thin-film transistor according to claim 8, further comprising:
   a passivation region abutting said second oxide region and a portion of said source/drain regions; and
   conductive contact regions adjacent a portion of said source/drain region not covered by said passivation region.

* * * * *